US007795552B2

(12) United States Patent
Maruyama et al.

(10) Patent No.: US 7,795,552 B2
(45) Date of Patent: Sep. 14, 2010

(54) CONTACT PIECE MEMBER, CONTACTOR AND CONTACT METHOD

(75) Inventors: Shigeyuki Maruyama, Kawasaki (JP); Toru Nishino, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/802,315

(22) Filed: May 22, 2007

(65) Prior Publication Data

US 2007/0222070 A1    Sep. 27, 2007

Related U.S. Application Data

(63) Continuation of application No. PCT/JP2004/018745, filed on Dec. 15, 2004.

(51) Int. Cl.
*H01H 1/02*    (2006.01)
(52) U.S. Cl. ...................................... 200/262
(58) Field of Classification Search ............... 200/262, 200/238, 502
See application file for complete search history.

(56) References Cited

U.S. PATENT DOCUMENTS

| | | | | |
|---|---|---|---|---|
| 2,295,338 A | * | 9/1942 | Ely ........................... | 29/880 |
| 3,488,841 A | * | 1/1970 | Stern ......................... | 29/879 |
| 4,547,640 A | * | 10/1985 | Kashiwagi et al. .......... | 218/123 |
| 7,339,127 B2 | * | 3/2008 | Renner et al. ............... | 200/262 |
| 2002/0013010 A1 | | 1/2002 | Maruyama et al. | |
| 2002/0140093 A1 | * | 10/2002 | Yamazaki et al. ........... | 257/734 |
| 2003/0205450 A1 | * | 11/2003 | Divigalpitiya et al. ...... | 200/512 |

FOREIGN PATENT DOCUMENTS

| | | |
|---|---|---|
| JP | 2002-5992 A | 1/2002 |
| JP | 2004-296301 A | 10/2004 |

OTHER PUBLICATIONS

International Search Report of PCT/JP2004/018745, date of mailing Mar. 1, 2005.

* cited by examiner

*Primary Examiner*—Michael A Friedhofer
*Assistant Examiner*—Lheiren Mae A Caroc
(74) *Attorney, Agent, or Firm*—Fujitsu Patent Center (57) ABSTRACT

In a contactor contact piece members can be arranged at a fine pitch, and a contact can be made surely by a small contact pressure. The contact piece members electrically connect an electronic part to an external circuit. The contact piece member is formed of an electrically conductive material in a generally spherical shape. A molecular density of a central part of the contact piece member is lower than a molecular density of a part near a surface. The electrically conductive material may include at least one of an electrically conductive fine particle, an electrically conductive fiber and an electrically conductive filler.

2 Claims, 7 Drawing Sheets

CONTACT POSITION

CONTACT PIECE MEMBER, CONTACTOR AND CONTACT METHOD

CROSS-REFERENCE TO RELATED APPLICATION

This application is a U.S. continuation application, filed under 35 USC 111(a) and claiming the benefit under 35 USC 120 and 365(c), of PCT application JP2004/018745 filed Dec. 15, 2004. The foregoing application is hereby incorporated herein by reference.

BACKGROUND OF THE INVENTION

1. Field of the Invention

The present invention relates to an electric connection technique of electronic parts and, more particularly, to a minute contact piece for making electrical conduction by contacting an electrode of a semiconductor device represented by an LSI and a contact piece member used for such a contact piece.

2. Description of the Related Art

In recent years, with the demand for high performance and miniaturization of electronic equipments, there also is a demand for high performance and miniaturization of semiconductor devices, such as an LSI to be mounted on an electronic equipment. Accordingly, it is required for the semiconductor device concerned to miniaturize wiring patterns and make a wafer thinner so as to integrate more circuits into a smaller volume.

Moreover, a higher speed operation is demanded, and the wiring patterns of the semiconductor device are miniaturized, and a reduction in wirings between circuits is attempted. Further, since more functions/circuits are integrated into a single semiconductor device, a number of terminals provided in the semiconductor device concerned is also increasing.

In such a situation, in order to perform a test for the semiconductor device concerned, a so-called contactor having contact pieces capable of stably contacting with many minute terminals is demanded.

If classified according to contact pieces used, contactors for an LSI test is classified into four kinds, that is, 1) a probe-type contactor, 2) a contactor using spring probes as contact pieces, 3) a contactor using a membrane probe as contact pieces, and 4) a contactor using an anisotropic conductive rubber as contact pieces.

1) Contactor of a Needle Type

Formed by arranging individual needles (needles formed of tungsten wire or the like) on a contactor substrate so as to match terminal positions of an LSI to be tested.

1-a) Cantilever System:

It is configured so that the needles extend in an inclined state from above to electrodes of a semiconductor device.

1-b) Perpendicular Needle System:

Conductive and perpendicularly standing needles (bar-like members) are used as contact pieces.

1-c) Bent Needle System:

Contactor using contact pieces having elasticity by bending a middle of conductive and perpendicularly standing needles.

2) Contactor Using Spring Probes as Contact Pieces

A probe pin is configured to have contact part to be contacted with a terminal of a semiconductor device and a contact part to be contacted with a substrate and a spring is arranged between the contact parts. An electric contact is acquired by pressing the contact parts onto the terminal of the semiconductor device and the substrate for test by elasticity of the spring between the contact parts.

3) Contactor Using a Membrane Probe as Contact Pieces

The membrane probe is formed as a film-like circuit board having metal protrusions as contact piece electrodes for probes.

4) Contactor Using an Anisotropic Conductive Rubber

The anisotropic conductive rubber is formed by using a rubber as an insulating material and embedding therein a material (metal wire or the like) which is conductive in only a direction of a thickness.

In any of the above-mentioned methods, pressurization of about 0.05 N (5 gf)–0.1 N (10 gf) is performed so as to stabilize and reduce an electric contact resistance.

The contact resistance is a sum of a film resistance, a constriction resistance and a resistance of a contact piece. The reason for a decrease in a contact resistance by pressurization is especially due to that the constriction resistance can be reduced.

Since minute unevenness exists in a surface of each of the contact piece and a terminal of an electronic part and an electric connection is performed by only the minute protrusions on the surfaces of the both, the substantial contact area is reduced and a high constriction resistance is generated.

Figure 1:
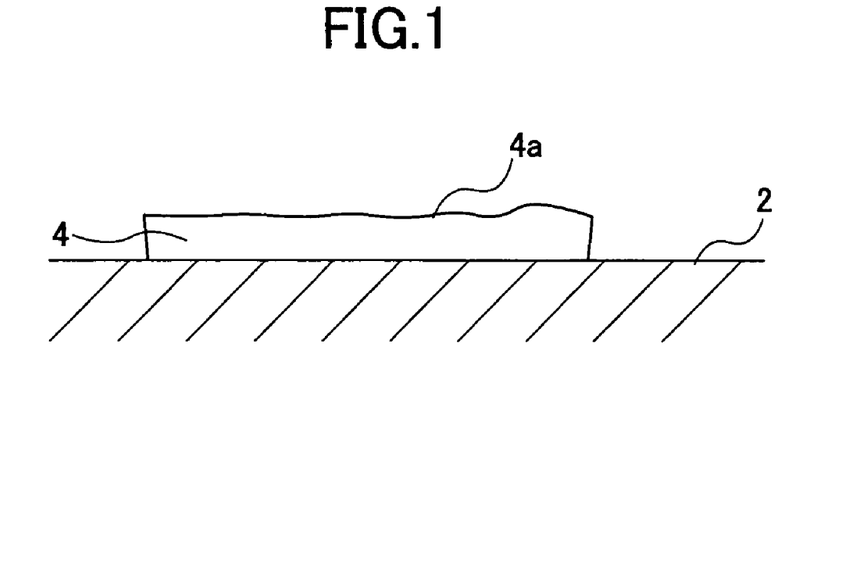
FIG. 1 is an enlarged side view of a rest terminal of a semiconductor chip.
Figure 2:
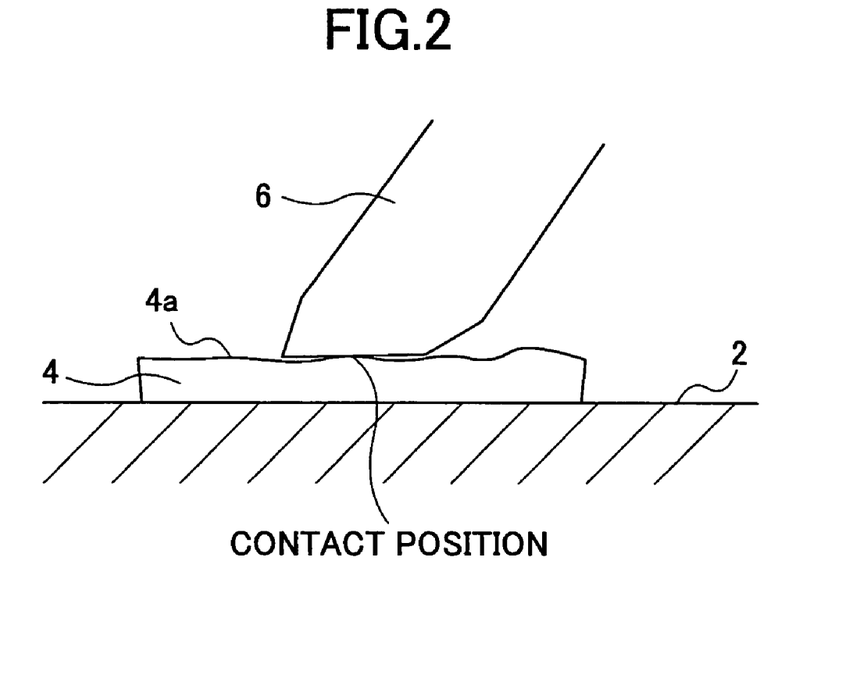
FIG. 2 is a side view showing a state where a contact piece is brought into contact with the test terminal shown in FIG. 1.

As shown in FIG. 1, a surface 4a of a terminal 4 for LSI test on a semiconductor chip 2 has irregularity when viewed microscopically. FIG. 2 is an illustration showing a state where a needle type contact piece 6 is brought into contact with the test terminal 4. The terminal surface 4a has unevenness as shown in FIG. 1, and when the needle type contact piece 6 is brought into contact with that, parts of the contact piece 6 and the surface 4a of the terminal 4 which are truly in contact are only a part. Accordingly, the constriction resistance at the contact part is large. The sum of the constriction resistance and the film resistance by a film on the contact piece surface is a contact resistance, and, thus, the contact resistance is high if the constriction resistance is high. For this reason, the contact area of the contact piece and the electronic part is increased by applying a large pressure between the both, thereby reducing the contact resistance.

Moreover, as a contact method other than the above-mentioned contactor, the following Patent Document 1 discloses a method of producing a hole for a contract electrode on a silicon substrate by using a silicon processing technique so as to locate the contact piece in the hole. Here, it is suggested to use a spherical or ring-like elastic material of which surface is given an electric conductivity.

Patent Document 1: Japanese Laid-Open Patent Application No. 2002-5992

From the demand for semiconductor devices such as an LSI, there are required the following functions.

A) Making minute terminals: A contactor having contact pieces with small intervals which can contact with minute terminals.

B) Making low-voltage: A contactor of which pressure when contacting is low and a contact resistance is in a stable and low state so as to reduce influences, when contacting, with respect to thinning of wafers.

As mentioned above, reduction of contact resistance is based on reduction of the constriction resistance due to expansion of a contact area. Generally, pressurization is made with a contact pressure of 0.05 N (5 gf)–0.1 N (10 gf) per one pin, and when calculating a sum with respect ten thousands terminals, it reaches up to 50 N-100 N, which gives a very large influence such as causing destruction of a semiconductor device to be tested.

C) Making area free: Contact piece electrodes can be arranged not only in a peripheral area but also in a lattice-like from. With increase in a number of terminals, there is a need to contact with not only terminals arranged in edge portions of a semiconductor chip but also terminals arranged in a lattice-like form on the semiconductor chip.

D) Making wide area: Contact pieces capable of contacting with a plurality of LSIs collectively.

As for the functions required, features in each structure/method of the above-mentioned contactors are as follows.

1) Contactor of a Needle System 1-a) Cantilever Method:

Terminal intervals on a substrate side are larger than terminal intervals on a wafer side, which provides a restriction in terminal arrangement on a structure and cannot be dealt with the above-mentioned issue C. Additionally, there is a large restriction with respect to the issue D. Accordingly, there is a problem in that, for example, terminals cannot be arranged in an area array state or contact cannot be made simultaneously with adjacent semiconductor chips since a probe size is larger than a chip size.

1-b) Perpendicular Needle System:

With respect to the issue A, the displacement is in a buckling mode, and a direction of needle bending cannot be specified. For this reason, there is a possibility that adjacent pins contact and detangle with each other. Additionally, with respect to issue B, it is difficult to acquire a stable contact at a low-pressure.

1-c) Bent Needle System:

Although it depends on a degree of bending, in order to arrange with a small pitch, adjacent needles (pins) become obstacles. Additionally, in the structure in which needles are bent one after another, a manufacturing cost is very high.

2) Contactor Using a Spring Probe (POGO-PIN) as a Contact Piece

There are Many Component Parts Such as a spring, a contact part and a barrel part accommodating the spring, and there is a limitation structurally in narrowing pitch. With respect to the issue A, there is a limitation structurally in narrowing pitch. That is, there is a limitation in reducing a winding diameter of the coil spring.

Moreover, with respect to the issue B, since there is no wiping action which can break an oxide film of an LSI terminal, a stable contact cannot be obtained at a low pressure. Additionally, in order to maintain positioning accuracy of a needle end, there is needed separately a part having holes processed with high accuracy 3) Contactor Using a Membrane Probe as a Contact Piece With respect to the issue A, since the contact electrodes are coupled by an insulating substrate, the individual electrode cannot move freely at a narrow pitch. Since a movable range of the contact electrode is small and it is a metal bump, it lacks flexibility. Thus, there is a problem in that a contact defect of a low bump is caused due to variation in heights of adjacent bumps.

On the other hand, with respect to the issue D, since wirings extend as threading between contact electrodes, there is a limitation in a number of wirings. Further, wirings of a membrane system do not progress in making multi-layered, and it is an extent in that wirings are provided on both sides of an insulating substrate. With respect to the issue B, it is difficult to obtain a stable contact since deformation cannot be made if there is no pressure of a certain degree.

4) Contactor Using an Anisotropic Conductive Rubber as a Contact Piece

With respect to the issue A, it cannot deal with narrowing pitch. Additionally, there are other problems such that a heat resistance is low, a durability is low or the like.

Moreover, although a contact electrode can be produced with narrow pitch according to the method disclosed in the above-mentioned Patent Document 1, it is difficult to form the rubber stably with a minute shape. Additionally, it is further difficult to form a metal or conductive film around the rubber. Further, if a conductive film can be formed, the durability thereof will be a problem.

As mentioned above, according to the contact pieces of the conventional technology, it is not possible to provide a contactor, which solves all issues such as A) making minute terminals, B) making a low pressure, C) making a wide area and D) making area free, and has durability in a minute size.

SUMMARY OF THE INVENTION

It is a general object of the present invention to provide an improved and useful contact piece member in which the above-mentioned problems are solved and a contactor using such a contact piece member.

A more specific object of the present invention is to provide a contact piece member which allows contact pieces being arranged at small pitch and achieves a contact surely with a small contact pressure and a contactor using such as contact piece member.

In order to achieve the above-mentioned objects, there is provided according to one aspect of the present invention a contact piece member formed of an electrically conductive material in a generally spherical shape and having a molecular density of a central part being lower than a molecular density of a surface part. In the above-mentioned contact piece, said electrically conductive material may include at least one of an electrically conductive fine particle, an electrically conductive fiber and an electrically conductive filler.

Additionally, there is provided according to the present invention a contact piece member for electrically connecting to an electronic part and a circuit board, which is formed of an electrically conductive material in a generally spherical shape and a central part is a cavity. In the above-mentioned contact piece, said electrically conductive material may include at least one of an electrically conductive fine particle, an electrically conductive fiber and an electrically conductive filler.

Additionally, there is provided further according to the present invention a contactor for electrically connecting to an electronic part and a circuit board, comprising: an insulating substrate; a retaining hole formed in the substrate; and at least one contract piece member arranged in the retaining hole, wherein the contact piece member is formed of an electrically conductive material in a generally spherical shape and a molecular density of a central part is lower than a molecular density of a surface part.

In the above-mentioned contactor, said electronic part may have a ball terminal as an external connection terminal, and a diameter of said contact piece member may be substantially equal to a diameter of the ball terminal. Additionally, a plurality of said contact piece members may be accommodated in said retaining hole in series.

Further, there is provided according to another aspect of the present invention, a contactor for electrically connecting to an electronic part and a circuit board, comprising: an insulating substrate; a retaining hole formed in the substrate; and at least one contact piece member arranged in the retaining hole, wherein the contact piece member is formed of an electrically conductive material in a generally spherical shape and a central part is a cavity. In the above-mentioned contactor, said electronic part may have a ball terminal as an external connection terminal, and a diameter of said contact piece member may be substantially equal to a diameter of the ball terminal.

Additionally, a plurality of said contact piece members may be accommodated in said retaining hole in series.

Additionally, there is provided according to another aspect of the present invention a contact method comprising: arranging a plurality of contact piece members in a retaining hole formed in an insulating substrate in a direction of thickness of the insulating substrate, the contact piece member having a molecular density of an inner part lower than a molecular density of a surface part; and acquiring electric continuity between the contact piece members by contacting and pressing a member to be contacted on both ends of the aligned contact piece members.

According to the present invention, there is provided a contact piece member, which has a generally spherical shape in a normal state, and a surface side thereof is solid (solid phase) and an interior thereof is hollow or liquid (liquid phase) or gelatinous having high fluidity so as to be elastically deformable by a small pressure.

Moreover, there is provided, according to an application of the contact piece member, a contactor having a contact piece which can be elastically deformed by a low pressure and can surely acquire electric contact by a large contact area between a terminal to be contacted in accordance with the surface state of the terminal to be contacted.

Other objects, features and advantages of the present invention will become more apparent from the following detailed description when read in conjunction with the accompanying drawings.

DETAILED DESCRIPTION OF THE PREFERRED EMBODIMENTS

Figure 3:
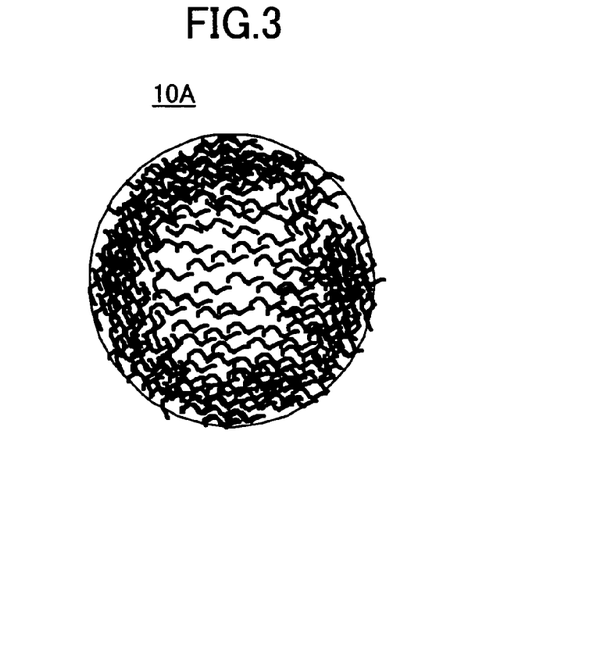
FIG. 3 is an illustration showing a structure of a contact piece member according to a first embodiment of the present invention.

A description will be given, with reference to FIG. 3, of a contact piece member according to a first embodiment of the present invention. FIG. 3 is an illustration of the contact piece member according to the first embodiment of the present invention.

The contact piece member shown in FIG. 3 functions as a contact piece, which is incorporated in a contactor and connects a terminal of a test substrate and an electrode of a semiconductor device, as mentioned later.

In FIG. 3, 10A is a contact piece member formed of an electrically conductive material according to the present invention. The contact piece member 10A is a generally spherical shape in a state where an external force is not exerted, and has an easily deformable characteristic when an external force is exerted. The contact piece member 10A is constituted by an electrically conductive polymer material, and a molecular density of the material is low and fluidity is high in an inner part thereof especially near a central part, and a molecular density is high and there is no fluidity or in a low state in the surface and a part near the surface. That is, the contact piece member 10A is constituted by one material but the inner part thereof is liquid (liquid phase) of gelatinous, and the surface and a part neat the surface are solid (solid state) such as a cover. Accordingly, the material of liquid or gel in the inner part is in a state where it is surrounded and sealed by the outer solid part and does not leak outside.

The contact piece member 10A, which has such a structure, functions as a contact piece because it is formed of an electrically conductive material. Since the inner part of the contact piece member 10A is liquid or gelatinous, it is deformable easily in response to a pressure from outside and can easily follow a shape of a contact part of a member to contact. That is, it can be deformed in accordance with a shape of the contact part of the member being pressed from outside.

For example, if a flat member is pressed onto the contact piece member 10A, a part of the contact piece member 10A, which is in contact with the flat member, becomes flat, thereby contacting in a state where a contact area is large. If a spherical member is pressed onto the contact piece member 10A, a part of the contact piece member 10A, which is in contact with the flat member, becomes a concave shape corresponding to the spherical surface, which results in contact with a large contact area.

Figure 4:
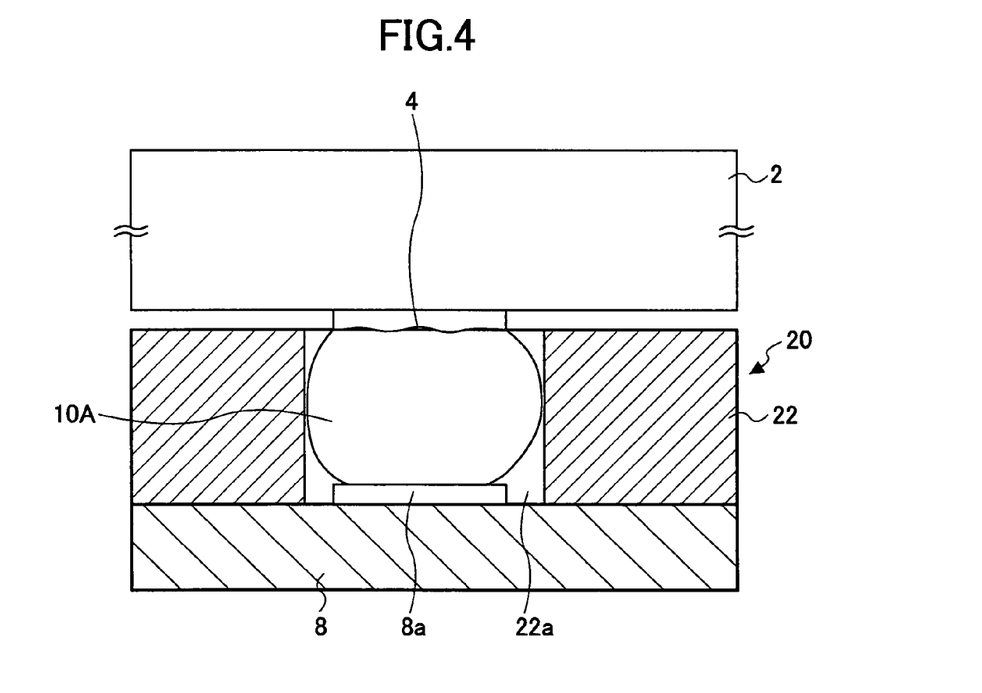
FIG. 4 is a cross-sectional view of a part of a contactor in which the contact piece member shown in FIG. 3 is incorporated, showing a state where a flat test terminal is pressed against the contact piece member.

FIG. 4 shows a state where the deformable contact piece member 10A is incorporated in a contactor and arranged between a test substrate and a semiconductor device to be tested. In the figure, one contact piece member 10A is accommodated and retained in a retaining hole 22a provided in a substrate 22 of the contactor 20. Portions of the contact piece member 10A can protrude from both surfaces (front surface and back surface) in a state where it is accommodated in the retaining hole 22a, or located in the vicinity of the surfaces so that they can contact with a test terminal 4 of the wafer 2 and a terminal 8a of the test board 8 on both sides. The substrate 22 of the contactor 20 can be formed using, for example, the same silicon as the wafer 2.

In the contactor structure shown in FIG. 4, the contact piece member 10A, which functions as a contact piece, contacts with the terminal 8a of the test substrate 8 at one end (lower side), and contacts with test terminal 4 of the wafer 2 (semiconductor device formed on the wafer) at the other end (upper side). The terminal 8a and the test terminal 4 are flat terminals, and the portions of the contact piece member 10A contact in a state where they become flat along the flat terminals. Thus, according to the contact piece member 10A, a large contact area can be maintained so as to contact with a substantially entire area of the surfaces of the terminal 8a and the test terminal 4, thereby allowing a reliable contact at a low contact resistance.

The contact piece member 10A is deformable by a small external force, and it can make a pressing force for causing the terminal 8a and the test terminal 4 vary small as compared to the aforementioned conventional contactor using contact needles.

It should be noted that, although, in the contactor shown in FIG. 4, only a part provided with one contact piece member 10A is shown, it is natural that a number of the contact piece members 10A corresponding to many test terminals 4 provided in the wafer 2 are provided. At this time, the pressing force applied to the wafer 2 to be tested is a sum of the pressing forces necessary for the contact of each contact piece member 10A, and, thus, the pressing force necessary for the contact of each contact piece member 10A must be reduced as the number of test terminals increases. In this viewpoint, the contact piece member 10A according to the present embodiment can achieve a reliable contact since it is deformable by a vary small external force, which contributes to a reduction in the pressing force applied to the entire wafer 2.

The reduction in the pressing force necessary for the contact of each contact piece member 10A causes a reduction in the pressing force to be applied to the wafer 2.

It should be noted that the test terminal of the semiconductor device to be contacted with the contact piece member is not limited to a flat shape. For example, there are many cases in which a protrusion electrode such as a solder ball or a bump is a terminal to be tested.

Figure 5:
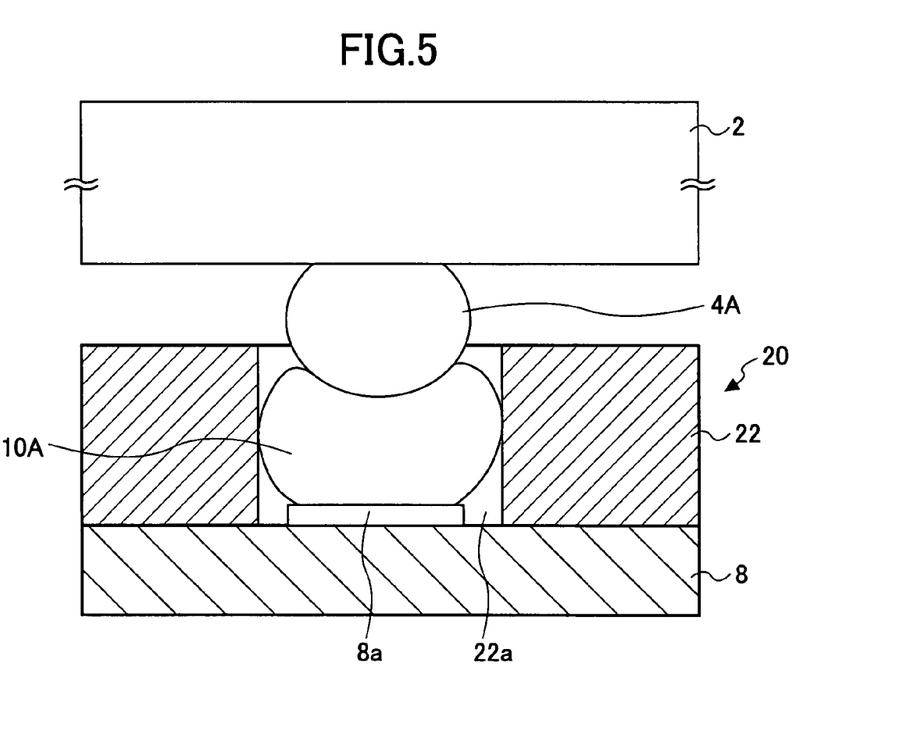
FIG. 5 is a cross-sectional view of a part of a contactor in which the contact piece member shown in FIG. 3 is incorporated, showing a state where a spherical test terminal is pressed against the contact piece member.

FIG. 5 shows a contact state of the contact piece member 10A in a case where the terminal to be tested is a ball-like electrode. As shown in the figure, since the contact piece member 10A according to the present invention is deformable along the outer surface of the ball-like electrode 4A, a contact area between the contact piece member 10A and the ball-like electrode 4A is increased, and, thereby, the both can contact with each other with a low contact resistance.

Figure 6:
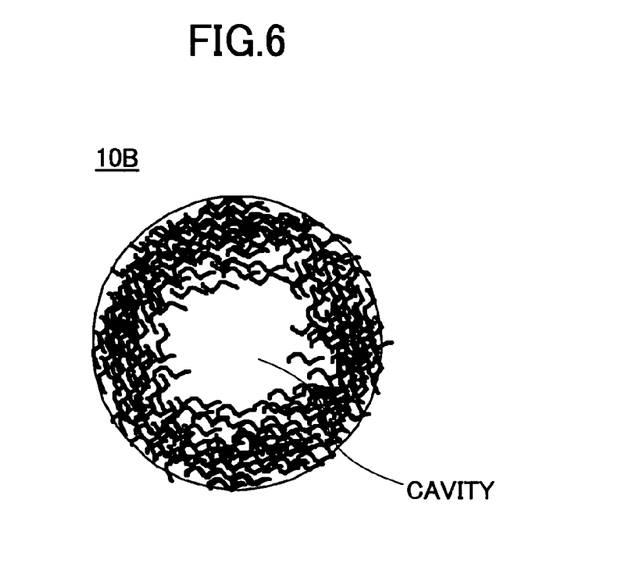
FIG. 6 is an illustration showing a structure of a variation of the contact piece member shown in FIG. 3.

Next, a description will be given, with reference to FIG. 6, of a variation of the contact piece member according to the first embodiment of the present invention. FIG. 6 shows a structure of a contact piece member 10B according to a variation of the first embodiment of the present invention.

Although the inner part of the above-mentioned contact piece member 10A shown in FIG. 3 is gelatinous or liquid, an inner part of the contact piece member 10B shown in FIG. 6 is a cavity.

A part of outer side of the contact piece member 10B is a cover film of solid (solid phase) similar to the contact piece member 10A, and has flexibility and elasticity of a certain degree. Accordingly, the contact piece member 10B is easily deformable in response to a pressure from outside in the same manner as the contact piece member 10A so that a reliable electric contact can be obtained at even a small contact pressure. The incorporation of the contact piece member 10B into a contactor is the same as the above-mentioned contact piece member 10A, and a description thereof will be omitted.

Thus, since the contact piece members 10A and 10B according to the present invention have the cover films of solid (solid phase) on the surfaces and the inner parts being liquid or gelatinous or hollow, they can perform elastic deformation easily in response to a shape of a member to contact, thereby contacting the member to be contact with a larger contact area. Thereby, a constriction resistance is reduced and a contact resistance is reduced and a reliable electric connection can be obtained even at a small pressure.

Moreover, the contact piece member according to the present invention can be formed in an extremely small size as mentioned below, and can be accommodated easily in the retaining hole for contact member provided in the substrate of the contactor. Accordingly, the contact piece member in the contactor can be arranged at a fine pitch corresponding to an electrode pitch of a semiconductor device to be tested.

A description will be given of a material and a forming method of the above-mentioned contact piece members 10A and 10B.

As an example of a forming method of the contact piece member, there is a method of solidifying a liquid of melted material of the contact piece member into a spherical shape by injecting it into a heated atmosphere. As a material suitable for such a forming method, there are listed electrically conductive polymers such as polyaniline, polypyrrole, polythiophene, etc.

Such an electrically conductive polymer turns into minute spherical shape due to surface tension when a solution thereof is injected from a nozzle to a heated atmosphere, and a surface part thereof is cured instantaneously. At this time, a cover film is formed since a molecular density in the surface part is increased due to the cure, but a molecular density in the inner part thereof becomes lower than the surface part and the inner part remains in a gelatinous or liquid form without being cured. As a result, the contact piece member 10A having a generally spherical shape in a normal state can be formed.

Moreover, depending on the material to be used or the conditions for curing the surface part, molecules are concentrated into the surface part and the inner part becomes hollow. Thereby, it is possible to form the contact piece member 10B having a generally spherical shape in a normal state.

A description will be given of a method of forming the contact piece members 10A and 10B using polyaniline.

First, adding hydrochloric acid to peroxo ammonium disulfate, and melt it completely. After sufficiently cooling the solution until it reaches below 0° C., the solution is added to a solution of aniline added with hydrochloric acid, and agitated sufficiently while continuing the cooling below 0° C. The sediment generated here is suction-filtered, and cleaned by hydrochloric acid, acetone, etc. The cleaned sediment is dried sufficiently, and the fine particles are smashed so as to be in a complete powder form.

Thus produced power is acid polyaniline. The power of the acid polyaniline is smashed into fine form, and make a solution by adding a slight amount of 1-methyl-2-pyrrolidone (N-methyl-2-pyrrolidinone).

This solution is sprayed into a heated atmosphere of 50° C. to 100° C. as mentioned above so as to cause the surface being cured, and, thereby, the contact piece member having a generally spherical shape in a normal state can be formed.

Instead of polyaniline, a solution prepared by dissolving a polymer material of polythiophene base into a volatile material such as chloroform or the like may be used.

By the method using the above-mentioned polyaniline, the spherical form contact piece member having a diameter of about 50 μm was formed, and the contact piece member was able to provide a displacement (deformation) of 25 μm in a vertical direction under a pressure of 0.3 gf.

Next, a description will be given of a contact piece member according to a second embodiment of the present invention.

The contact piece member according to the second embodiment has the same structure as the contact piece members 10A and 10B according to the first embodiment of the present invention, that is, the structure shown in FIG. 3 or FIG. 6, but differs in a point that conductive fine particles are contained in an outer side cover film and an inner side gel or liquid.

As a material to form the contact piece member, there is used the material to form the above-mentioned contact piece members 10A and 10B added with electrically conductive particles. As the electrically conductive particles, metal particles or carbon particles, which are not corroded by hydrochloric acid or the like are suitable. Additionally, fine fibers of gold or carbon may be added as the electrically conductive particles.

A specific forming method is the same as the method of forming the above-mentioned contact piece members 10A and 10B, and a description thereof will be omitted. The contact piece member of a diameter of 50 μm was formed by adding electrically conductive fine particles, and a displacement (deformation) of 25 μm was obtained in a vertical direction under a pressure of 0.003 N (0.3 gf).

By adding the electrically conductive particles into the material as mentioned above, an electric resistance and a contact resistance of the contact piece member can be reduced and more reliable electric continuity and electric connection can be obtained. For example, it is effective for a case where a plurality of electrically conductive members are arranged in series and incorporated into a contactor.

Thus, even the contact piece members 10A and 10B added with the electrically conductive fine particles are deformable by a low pressing force since the surfaces thereof are solid (solid phase) cover film and the inner parts are liquid or gelatinous or hollow, thereby contacting a member to contact with a larger contact area.

Next, a description will be given of a contact piece member according to a third embodiment of the present invention.

In order to form a contact piece member having an inner part made of a gel having a low molecular density and a surface made of a thin film having a high molecular density, for example, a solution of sodium alginate as a mother material in which an electrically conductive material is contained is prepared. (The electrically conductive material may be the polymer material mentioned in the first embodiment, the electrically conductive fibers mentioned in the second embodiment, or a metal such as mercury exhibiting liquid phase below 150° C., or an alloy thereof.) This solution is dropped into a solution of calcium chloride or calcium lactate of 1 weight percent or more.

The molecular density of only the surface of the dropped contract piece material becomes high due to an osmotic pressure and a reaction with calcium within the solution of calcium chloride or calcium lactate and the inner part is confined as liquid phase, thereby forming an electrically conductive capsule having elasticity. Since the size of the capsule is proportional to a volume of the dropped contact piece material, a capsule of a diameter of about 10 μm can be formed by spraying a minute amount.

Next, a description will be given of a contactor structure using the contact piece member according the above-mentioned present invention.

Figure 7:
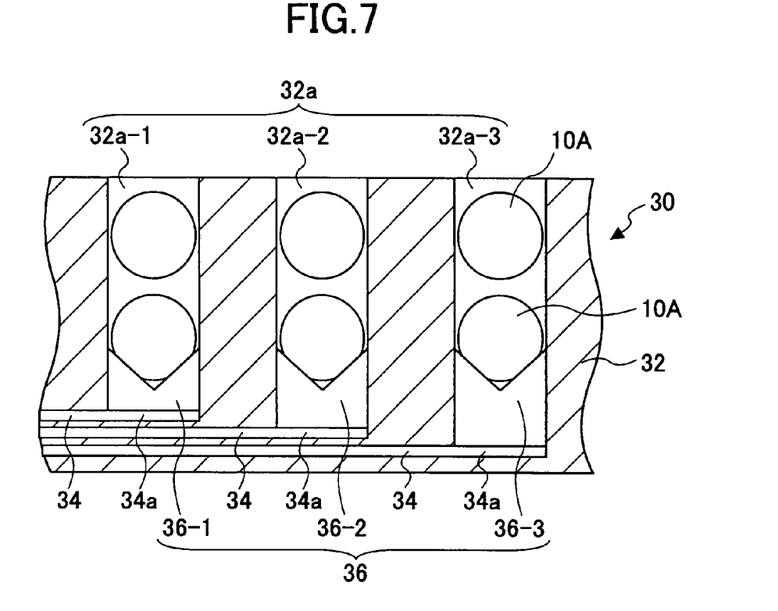
FIG. 7 is a cross-sectional view showing a part of a contactor in which a plurality of contact piece members are arranged in series.

FIG. 7 is a cross-sectional view showing a contactor in which a plurality of the contact piece members 10A (two pieces in the figure) are accommodated and arranged in a retaining hole provided in a contactor substrate in series in a direction of thickness of the substrate. In the figure, the substrate 32 of the contactor 30 has a plurality of retaining holes 32a corresponding to a number of electrodes of a semiconductor device.

A terminal 34a is provided in a bottom part of each retaining hole 32a, and the terminal 34a is lead outside by a multi-layer structure made of a plurality of wiring layers 34 and connected to a test/inspection apparatus (not shown in the figure). Because such a multi-layer structure is applied, distances between bottom parts of the retaining holes 32a and the corresponding terminals 34a differ from each other.

Accordingly, an adjuster 36 made of an electrically conductive material is provided in a bottom part of each of the retaining hole 32a, and the contact piece member 10A is accommodated and arranged on the adjuster 36. The adjusters 36 are provided so that positions of the upper ends of the contact piece members 10A at the retaining holes 32a are equal to each other when the contact pieces 10A are provided in the retaining holes 32a. Accordingly, a small height (thin) adjuster 36-1 is provided in the shallow retaining hole 32a-1 and a large height (thick) adjuster 36-3 is provided in a deep retaining hole 32a-3.

As mentioned above, by arranging a plurality of the contact piece members 10A in series, an amount of displacement (amount of deformation) can be increased as the entire contact piece member while maintaining a pressing force small. This provides an effect that variation in heights between a plurality of terminals (solder balls in the figure) to contact is absorbed.

Figure 8:
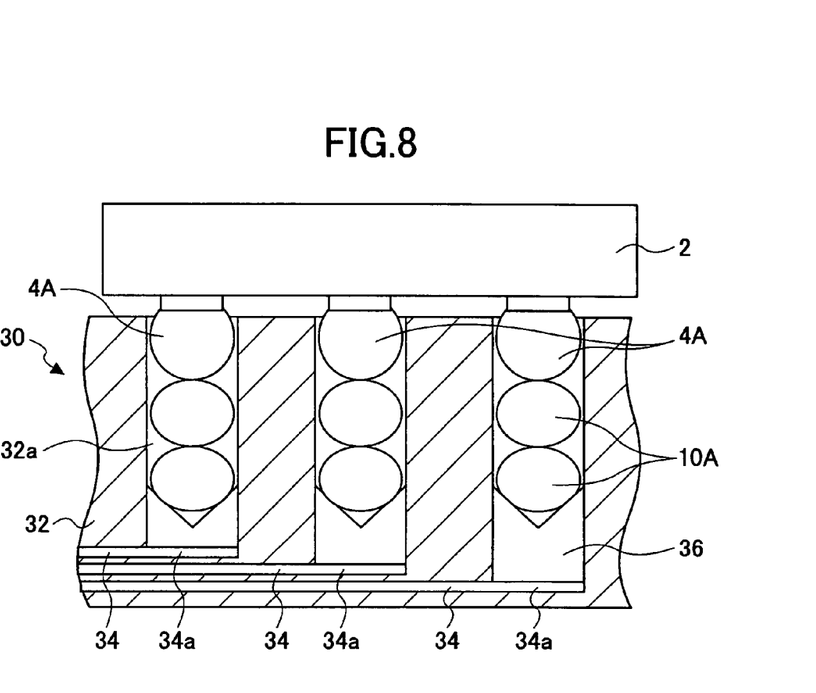
FIG. 8 is a view showing a state of the contactor when a wafer provided with ball terminals as protrusion electrodes is brought into contact with the contactor shown in FIG. 7.

FIG. 8 shows a state of a contactor when ball terminals 4A of the wafer 2 as protrusion electrodes are brought into contact with the contactor 30 shown in FIG. 7.

Here, the ball terminal 4A of the wafer 2 is in the same size as the contact piece member 10A, and contacts with the contact piece member 10A while pressing in a state where it is inserted into the retaining hole 32a. That is, the retaining hole 32a exhibits not only retaining the contact piece member 10A but also guiding the ball terminal 4A when pressing the wafer 2 onto the contactor 30.

Figure 9:
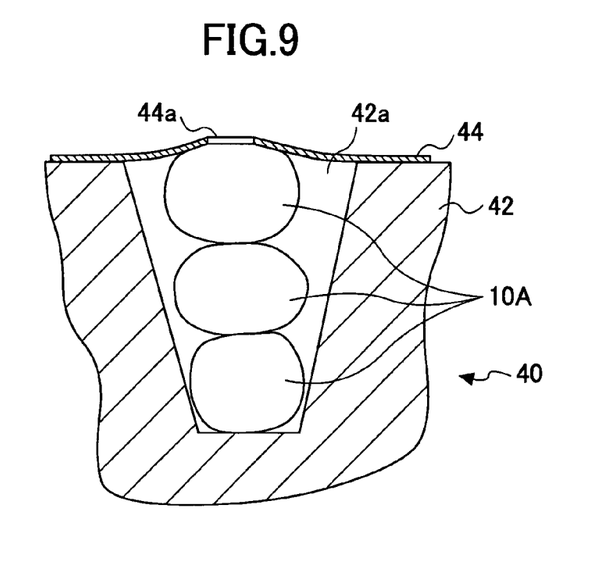
FIG. 9 is a cross-sectional view showing a part of an example of a contactor using a contact piece member.

Moreover, a contactor 40 shown in FIG. 9 has a structure in which a plurality of the contact piece members 10A (three pieces in FIG. 9) are accommodated and arranged in a retaining hole 42a provided on one of the primary surfaces of a substrate 42 made of a silicon substrate or the like in a serial state, and further an insulating protective film 44 is applied onto the primary surface of the substrate 42 including above the accommodating portion of the contact piece members 10A.

The contact piece members 10A and a terminal (not shown in the figure) of the above-mentioned wafer 2 are electrically connected to each other through an electrically conductive part 44a provided in the insulating protective film 44 in accordance with the contact piece members 10A.

It should be noted that, although not shown in the figure, a multi-layer wiring structure is provided on the side of the other primary surface similar to the contactor structure shown in FIG. 7 and FIG. 8, and the contact piece member 10A in each retaining hole 42a is electrically connected to an external test/inspection apparatus through the multi-layer wiring.

By providing the above-mentioned insulating protective film 44, the contact piece members 10A can be retained surely in the retaining hole 42a.

In the contactor 40, a taper is applied to the retaining hole 42a so that a bottom part side is narrower than an opening part side, and when the contact piece members 10A are pressed from above, a deformation of the contact piece member 10A on the lower side in a transverse direction is limited. Thereby, a deformation in a vertical direction is suppressed, which does not invite a reduction in a pressing force.

Figure 10:
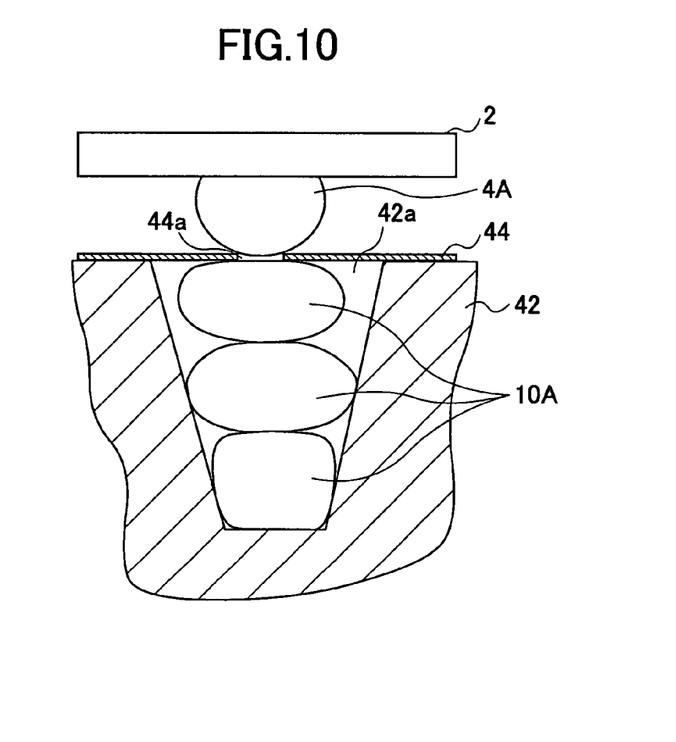
FIG. 10 is a view showing a state where a wafer having ball electrodes is brought into contact with the contactor shown in FIG. 9.

FIG. 10 shows a state where ball electrode 4A, which is an electrode in the wafer 2, is brought into contact with the above-mentioned contactor shown in FIG. 9.

The ball terminal 4A of the wafer 2 contacts with the electrically conductive part 44a of the insulating protective film 44, and the contact piece members 10A are pressed by the ball terminal 4A through the electrically conductive part 44a and deform elastically.

At this time, the contact piece member 10A contact with the electrically conductive part 44a with a large contact area, but the ball electrode 4A does not deform and a contact area thereof is small.

Figure 11:
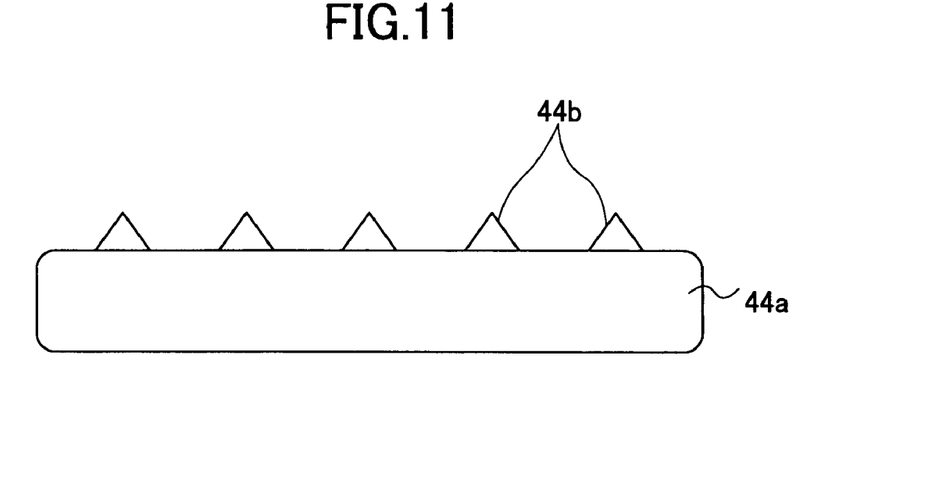
FIG. 11 is an enlarged view of an electrically conductive part shown in FIG. 9.

Thus, in order to ensure the contact between the electrically conductive part 44a and the ball terminal 4A, a minute protrusion 44b may be provided on an outer surface of the electrically conductive part 44a.

The protrusion 44b of the electrically conductive part 44a breaks a film such as a natural oxide film located on the surface of the ball electrode 4A when the ball electrode 4A is pressed, and, thus, the electrical contact between the electrically conductive part 44a and the ball electrode 4A is achieved surely.

Figure 12:
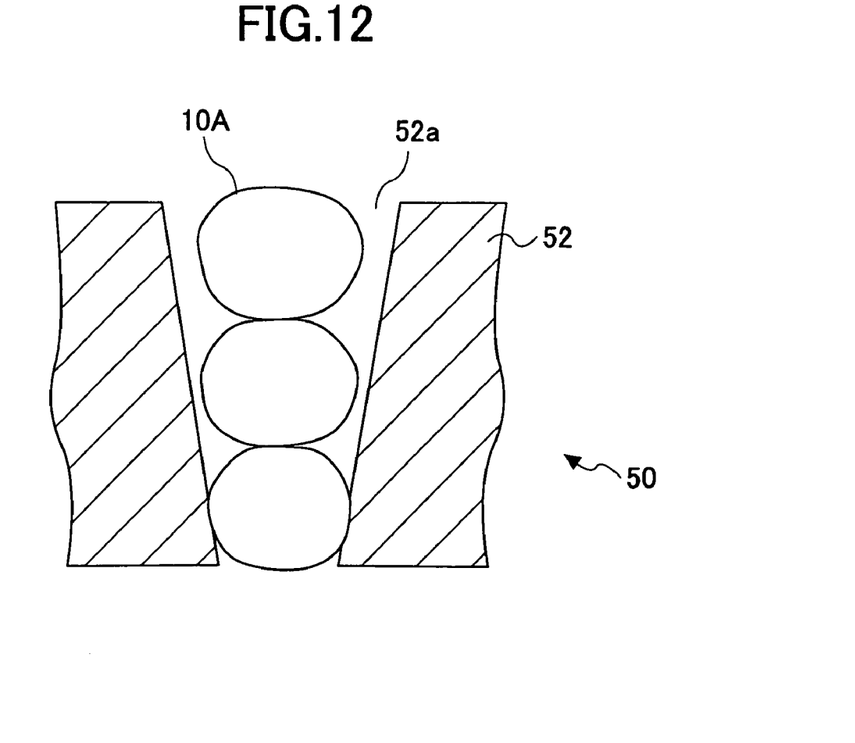
FIG. 12 is a cross-sectional view showing a part of a contactor in which a plural number of contact piece members are arranged in series.

FIG. 12 shows a part of a contactor in which a plurality of contact piece members 10A (three pieces in the figure) are accommodated and arranged in a contactor substrate and a part of the contact piece member protrudes slightly from the contactor. In the contactor 50 shown in FIG. 12, three pieces of the contact piece members 10A are accommodated and arranged and retained in a retaining hole 52a provided in a substrate 52 formed of a silicon substrate or the like in series in a direction of thickness of the substrate 52

Here, the retaining hole 52a is formed with a taper so that the diameter thereof is reduced from one of primary surfaces of the substrate 52 toward the other (back surface) of the primary surfaces so that a diameter of the opening part on the other of the primary surfaces of the substrate 52 is smaller than a diameter of the contact piece member 10A. Thus, the lowermost contact piece member 10A is accommodated in the retaining hole 52a in a state where a part slightly protruded from the opening part of the back surface of the substrate 52, and two contact piece members 10A are accommodated and arranged thereon. The uppermost contact piece member 10A is retained in a state where a part thereof slightly protrudes from the front surface of the substrate 52.

Similar to the above-mentioned contactor 20 shown in FIG. 4, the contactor 50 is arranged between the wafer 2 and the test substrate 8 so as to connect the test electrodes of the wafer 2 and the terminals 8a of the test substrate 8 to each other.

Since the contactor 50 has a structure in which a plurality of the contact piece members 10A are connected in series, a large amount of deformation can be obtained in the contact piece members as compared with the contactor 20 shown in FIG. 4.

Figure 13:
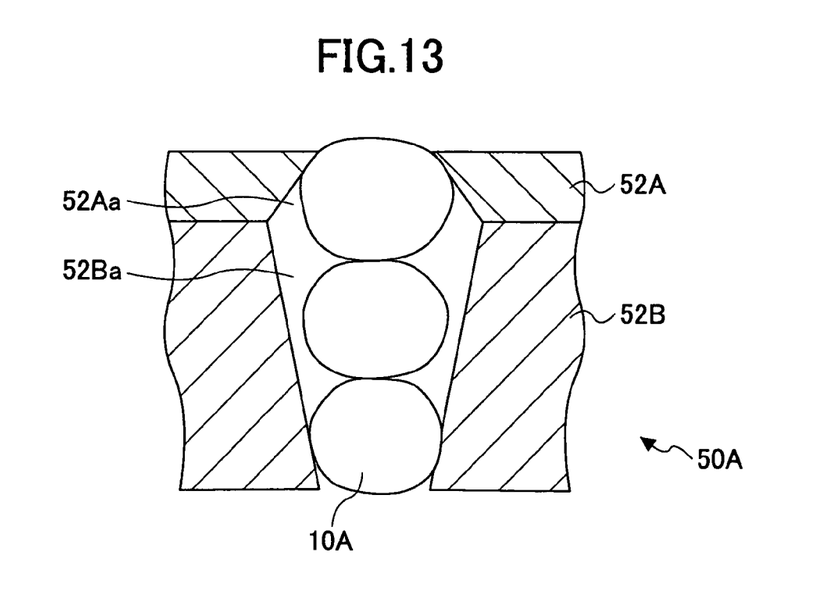
FIG. 13 is a cross-sectional view showing a part of a contactor having the contactor shown in FIG. 12 of which substrate is divided into an upper side substrate and a lower side substrate.

FIG. 13 shows a part of the contactor 50 in which the substrate 52 of the contactor 50 shown in FIG. 12 is divided into an upper substrate 52A and a lower substrate 52B. In the figure, a retaining hole 52Ba is formed in the lower substrate 52B, the retaining hole being provided with a taper, similar to the retaining hole 52a of the substrate 52 shown in FIG. 12 so that a smaller opening is formed on the lower primary surface as compared with an opening on the primary surface on the side facing the upper substrate 52A.

On the other hand, a retaining hole 52Aa is formed in the upper substrate 52A at a position corresponding to the retaining hole 52Ba of the lower substrate 52B, the retaining hole being provided with a taper reversed from the retaining hole 52Ba so that a smaller opening is formed on the upper primary surface as compared with an opening on the primary surface on the side facing the lower substrate 52B.

According to the above-mentioned structure, the plurality of contact piece members 10A are accommodated in a serial state in the retaining holes 52Aa and 52Ba by the substrate 52A and the substrate 52B, and the contact piece members located on both upper and lower ends are retained in a state where parts thereof protrude from openings provided in the substrate.

Even in the present contactor structure, the plurality of contact piece members 10A are connected in series, a large amount of deformation can be obtained in the contact piece members as compared with the contactor 20 shown in FIG. 4.

The contact piece member according to the present invention can be used in an application other than contactors.

Figure 14:
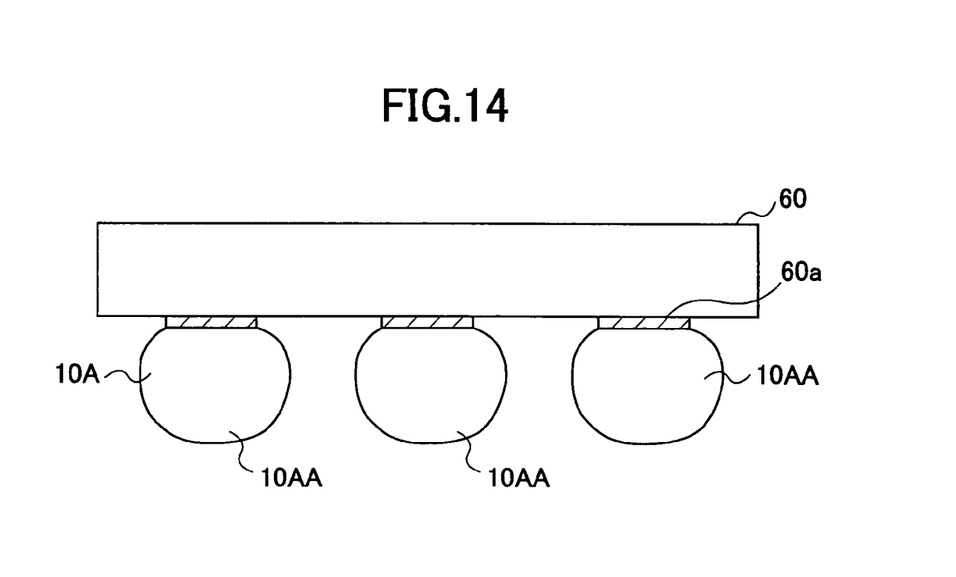
FIG. 14 is a side view showing an example using the contact piece member as an external connection terminal of a semiconductor device.

FIG. 14 shows an example using the contact piece member according to the present invention as an external connection terminal 10AA of a semiconductor device. In the figure, the contact piece member 10A is fixed in each of the electrodes 60a of the semiconductor integrated circuit element (LSI) and functions as the external connection terminal 10AA.

By using the contact piece member 10A according to the present invention as the external connection terminal 10AA, a contact surface of the external connection terminal 10AA to the external connection part (not shown in the figure) can be increased, thereby acquiring a reliable electric connection. Additionally, variation in the heights of the terminals (not shown in the figure) on the circuit board to which the external connection terminal 10AA and the external connection terminals are connected can be absorbed by deformation of the external connection terminal 10AA.

It should be noted that although the description has been given of the above-mentioned contactor and semiconductor device by applying the contact piece member 10A according to the first embodiment of the present invention, the contact piece member according to the second embodiment of the present invention may be used.

The present invention is not limited to the specifically disclosed embodiments, and variations and modifications may be made without departing from the scope of the present invention.

What is claimed is:

1. A contact piece member formed of an electrically conductive polymer material and having a generally spherical shape in a normal state and being elastically deformable, the contact piece member comprising:
   a central part formed of the electrically conductive polymer material and having a first molecular density; and
   a peripheral part surrounding the central part, the peripheral part formed of the electrically conductive polymer material and having a second molecular density,
   wherein the first molecular density is lower than the second molecular density, and a value of the first molecular density is not zero, and
   wherein a surface of said contact piece member is a solid film, and an inside of said contact piece member is in a liquid state or a gel state.

2. The contact piece member as claimed in claim 1, including at least one of an electrically conductive fine particle, an electrically conductive fiber and an electrically conductive filler.

* * * * *